(12) United States Patent
Anzou et al.

(10) Patent No.: US 8,032,803 B2
(45) Date of Patent: Oct. 4, 2011

(54) SEMICONDUCTOR INTEGRATED CIRCUIT AND TEST SYSTEM THEREOF (75) Inventors: Kenichi Anzou, Kawasaki (JP);
Chikako Tokunaga, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 588 days.

(21) Appl. No.: 12/164,518

(22) Filed: Jun. 30, 2008

(65) Prior Publication Data
US 2009/0024885 A1 Jan. 22, 2009

(30) Foreign Application Priority Data

Jul. 19, 2007 (JP) .................................. 2007-187937

(51) Int. Cl.
G11C 29/00 (2006.01)
G06F 11/00 (2006.01)
(52) U.S. Cl. ........................................ 714/719; 714/742
(58) Field of Classification Search .................. 714/718, 714/719, 727, 729, 733, 742
See application file for complete search history.

(56) References Cited

U.S. PATENT DOCUMENTS

| 6,668,348 | B1 * | 12/2003 | Nakamura | 714/733 |
|---|---|---|---|---|
| 6,691,264 | B2 * | 2/2004 | Huang | 714/723 |
| 7,057,948 | B2 * | 6/2006 | Shimizu et al. | 365/200 |
| 7,203,873 | B1 * | 4/2007 | Adams et al. | 714/718 |
| 7,206,984 | B2 | 4/2007 | Anzou | |
| 7,213,186 | B2 | 5/2007 | Chien | |
| 7,653,854 | B2 * | 1/2010 | Anzou et al. | 714/733 |
| 2001/0041967 | A1 * | 11/2001 | Nakayama | 702/117 |
| 2007/0011535 | A1 | 1/2007 | Anzou et al. | |
| 2008/0022176 | A1 | 1/2008 | Anzou et al. | |

FOREIGN PATENT DOCUMENTS

JP  2008-016156  1/2008

OTHER PUBLICATIONS

"Microsoft Computer Dictionary fifth edition" published by Microsoft Press 2002 pp. 61 and 333.*
"IEEE 100 The Authoritative Dictionary of IEEE Standards Terms seventh edition" IEEE Press Publication 2000 p. 685.*
Yuejian Wu; Liviu Calin; , "Shadow write and read for at-speed BIST of TDM SRAMs," Test Conference, 2001. Proceedings. International , vol., No. pp. 985-994, 2001 doi: 10.1109/TEST.2001. 966723 URL: http://ieeexplore.ieee.org/stamp/stamp.jsp?tp=&arnumber=966723&isnumber=20866.*
Bertuccelli, F.; Bigongiari, F.; Brogna, A.S.; Di Natale, G.; Prinetto, P.; Saletti, R.; , "Exhaustive test of several dependable memory architectures designed by GRAAL tool," Test Symposium, 2003. ATS 2003. 12th Asian , vol., No. pp. 32-35, Nov. 16-19, 2003doi: 10.1109/ATS.2003.1250779 URL: http://ieeexplore.ieee.org/stamp/stamp.jsp?tp=&arnumber.*

* cited by examiner

*Primary Examiner* — Cynthia Britt
(74) *Attorney, Agent, or Firm* — Turocy & Watson, LLP (57) ABSTRACT

A semiconductor integrated circuit has a memory collar including a memory cell configured to store a written data pattern and read and output the data pattern, and a register configured to store a failed data pattern, and a built-in self test circuit configured to write the data pattern in the memory cell, output expected value data, and decide whether to continue a test or suspend the test to output failure information to outside, based on a comparison result of the data pattern outputted from the memory cell and the expected value data and a comparison result of the data pattern and the failed data pattern.

20 Claims, 11 Drawing Sheets

⊠ FAILURE DETECTED POINT

☒ FAILURE DETECTED POINT

SEMICONDUCTOR INTEGRATED CIRCUIT AND TEST SYSTEM THEREOF

CROSS REFERENCE TO RELATED APPLICATIONS

This application is based upon and claims benefit of priority from the prior Japanese Patent Application No. 2007-187937, filed on Jul. 19, 2007, the entire contents of which are incorporated herein by reference.

BACKGROUND OF THE INVENTION

The present invention relates to a semiconductor integrated circuit and a test system thereof.

Built-in self test (hereinafter, will be referred to as BIST) circuits are incorporated into semiconductor integrated circuits including memories, and the BIST circuits are used to conduct BISTs to identify the presence or absence of failures in memories and locate failures.

BIST circuits include a comparator BIST circuit which compares a data expected value equal to written data and data read from a memory and identifies the presence or absence of a failure, and a compressor BIST circuit which compresses, in the BIST circuit, data read from a memory and identifies the presence or absence of a failure by using the compression result.

The following will describe BIST operations in a conventional semiconductor integrated circuit including a comparator BIST circuit.

A BIST control circuit in the BIST circuit controls a data generator, an address generator, a control signal generator, and a result analyzer. A BIST target memory is included in a block called a memory collar, together with logical elements required for BIST operations.

The memory is fed with written data generated from the data generator, address data generated from the address generator, and a control signal generated from the control signal generator.

Data outputted from the memory is temporarily stored in a capturing register disposed on the output side of the memory. An output from the capturing register is compared by a comparator with a data expected value generated from the data generator, and the comparison result is held in a flag register. An output from the flag register is inputted to the result analyzer in the BIST circuit, and a final BIST result is outputted.

When conducting BISTs on a plurality of memories in a single BIST circuit, flag data from the memories is inputted to the result analyzer, the presence or absence of a failure is determined based on the overall BISTs, and then a final BIST result is outputted.

Further, when failure diagnosis is conducted with a BIST circuit to extract possible locations of failures in memories, output data is serially extracted from the plurality of memories to the outside and is observed by an external tester.

When using the aforementioned comparator BIST circuit, the capturing registers for capturing memory outputs in the memory collars and the flag registers for receiving outputs from the comparators in the memory collars are all serially connected. Moreover, the registers, an address register fed with an address from an address generating circuit in the BIST circuit, and the flag register of the overall BIST are all serially connected, so that a circular shift path is formed in the overall BIST circuit.

The shift path is used in failure diagnosis and register values are shifted out according to the timing of reading.

Since the shift path is formed in a circulating manner, the circuit can recover to the suspended state of the BIST operation after the end of shifting-out.

After that, the BIST is restarted and register values are shifted out on the subsequent timing of reading. By repeatedly suspending the BIST operation, shifting out register values, and restarting the BIST operation, it is possible to read states in the memories. Based on obtained results, a fail bit map indicating the bit position of a failure in the cell array of the memory is produced and failure analysis is conducted.

However, such a conventional technique requires serial reading of all the BIST results and thus register values have to be shifted out also from memories other than the target of failure diagnosis. Therefore, BISTs conducted on a large number of memories in a single BIST circuit result in an extremely long failure diagnosis time.

Further, for example, when similar failed patterns consecutively appear, it is necessary to detect a failure, suspend the BIST operation, shift out a register value, and restart the BIST operation at each address, resulting in an extremely long failure diagnosis time.

Moreover, when BIST results are shifted out, the shift outputs are observed and compared with an expected value in the external tester. The observation and comparison are restricted because the operating speed of the external tester is lower than the operating speed (actual speed) of a semiconductor integrated circuit in an actual operation.

Therefore, it has been difficult to conduct failure diagnosis at the actual speed of the semiconductor integrated circuit and it has not been possible to detect possible failures which can be detected only by failure diagnosis at the actual speed.

SUMMARY OF THE INVENTION

According to one aspect of the present invention, there is provided a semiconductor integrated circuit, comprising:

a memory collar including a memory cell configured to store a written data pattern and read and output the data pattern, and a register configured to store a failed data pattern; and a built-in self test circuit configured to write the data pattern in the memory cell, output expected value data, and decide whether to continue a test or suspend the test to output failure information to outside, based on a comparison result of the data pattern outputted from the memory cell and the expected value data and a comparison result of the data pattern and the failed data pattern.

According to one aspect of the present invention, there is provided a semiconductor integrated circuit, comprising:

a built-in self test circuit; and a memory collar, the built-in self test circuit including a data generator configured to generate and output written data and a data expected value;

an address generator configured to generate and output an address signal;

a control signal generator configured to generate and output a control signal;

a result analyzer which is fed with a flag signal to analyze a result of a built-in self test and outputs a built-in self test result signal;

a built-in self test control circuit configured to control operations of the data generator, the address generator, the control signal generator, and the result analyzer, output a built-in self test state signal indicating a state of the built-in self test, and decide whether to suspend the built-in self test based on a consecutive failure flag signal;

a diagnosis data storing circuit including a first capturing register configured to capture and output, according to a first clock while the flag signal is not supplied, the latest address signal outputted from the address generator and the latest built-in self test state signal outputted from the built-in self test control circuit, and keep an output when the flag signal is supplied; a storing register configured to store the address signal and the built-in self test state signal at the supply of the flag signal by storing, while a shift enable signal is not supplied, a supplied output from the capturing register according to a second clock having a lower speed than the first clock, and shift out stored contents to outside at the supply of the shift enable signal; and flag suppressing unit configured to compare an output from the first capturing register and the stored contents of the storing register to output a flag suppressing signal until the latest address signal and the built-in self test state signal which are outputted from the first capturing register match with the address signal and the built-in self test state signal which are stored in the storing register after the flag signal is supplied once, the memory collar including a memory cell fed with the written data, the address signal, and the control signal to perform a writing operation according to the first clock, and reading and outputting the written data; and a memory output analyzing circuit including a second capturing register which is fed with and captures latest data outputted from the memory cell while the shift enable signal is not supplied and the flag signal is not supplied, keeps stored contents when fed with the flag signal, and shifts out the stored contents to the outside when fed with the shift enable signal; a first comparing circuit configured to compare an output from the second capturing register and the data expected value and output a first comparison result signal indicating detection of a failure in the event of a mismatch; a flag register configured to output the flag signal based on the first comparison result signal while the register is not fed with the flag suppressing signal, and suppress an output of the flag signal when fed with the flag suppressing signal; an output pattern storing register which is fed with and captures latest data outputted from the second capturing register and outputs the data while the register is not fed with the flag signal, and keeps an output when fed with the flag signal; a second comparing circuit configured to compare the output from the second capturing register and the output from the output pattern storing register, and output a second comparison result signal indicating consecutive failures in the event of a match; and a consecutive failure flag register configured to output the consecutive failure flag signal based on the second comparison result signal while the register is not fed with the shift enable signal, and shift out stored contents to the outside when fed with the shift enable signal.

According to one aspect of the present invention, there is provided a test system of a semiconductor integrated circuit, comprising:

the semiconductor integrated circuit; and a tester configured to output the shift enable signal according to the second clock, analyze a bit position of a failure in the memory cell based on the built-in self test result signal, a shift output from the storing register, a shift output from the second capturing register, and a shift output from the consecutive failure flag register, and produce a fail bit map.

DESCRIPTION OF THE EMBODIMENTS

The following will describe an embodiment of the present invention in accordance with the accompanying drawings.

Figure 1:
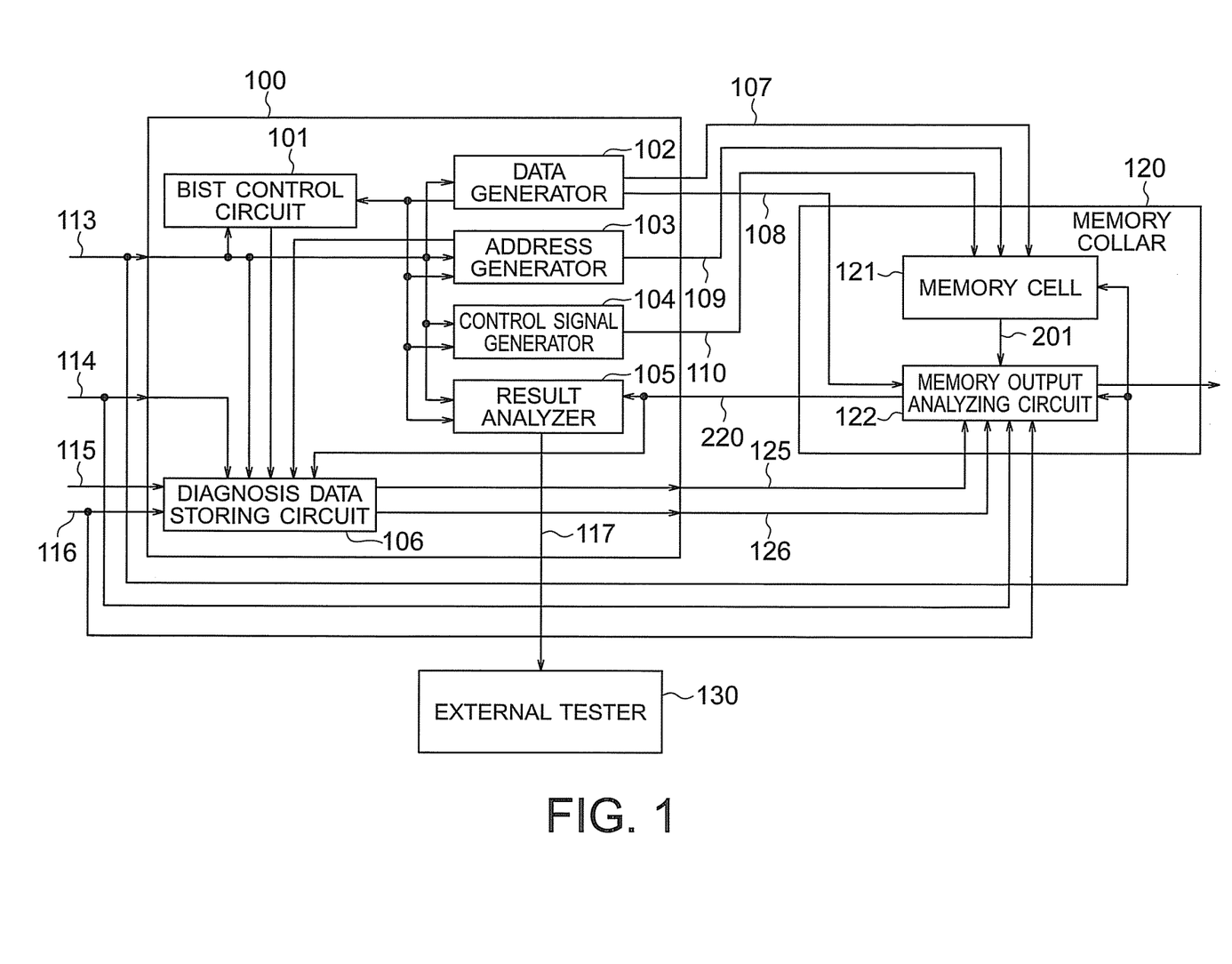
FIG. 1 schematically shows the configuration of a semiconductor integrated circuit according to an embodiment of the present invention.

FIG. 1 schematically shows the configuration of a semiconductor integrated circuit according to the embodiment of the present invention. The semiconductor integrated circuit includes a BIST circuit 100 and a memory collar 120. The BIST circuit 100 includes a BIST control circuit 101, a data generator 102, an address generator 103, a control signal generator 104, a result analyzer 105, and a diagnosis data storing circuit 106.

The memory collar 120 includes a memory cell 121 serving as a BIST target and a memory output analyzing circuit 122.

In the BIST circuit 100, the BIST control circuit 101, the data generator 102, the address generator 103, the control signal generator 104, the result analyzer 105, and the diagnosis data storing circuit 106 are fed with a high speed clock 113.

A BIST result 117 outputted from the result analyzer 105 is supplied to an external tester 130. The external tester 130 controls the output of a shift enable signal 116.

The memory cell 121 and the memory output analyzing circuit 122 are also fed with the high speed clock 113. The diagnosis data storing circuit 106 and the memory output analyzing circuit 122 are also fed with a low speed clock 114.

The BIST control circuit 101 controls the operations of the data generator 102, the address generator 103, the control signal generator 104, the result analyzer 105, and the diagnosis data storing circuit 106 and sequentially generates signals required for conducting BISTs.

Written data 107 generated in the data generator 102, address data 109 generated in the address generator 103, and a memory control signal 110 generated in the control signal generator 104 are supplied to the memory cell 121. Thus the data is written in the memory cell 121.

Data 201 read from the memory cell 121 is inputted to the memory output analyzing circuit 122. The memory output analyzing circuit 122 is fed with a data expected value 108 equal to the written data 107 generated in the data generator 102 and decides whether or not the data 201 read from the memory cell 121 matches with the data expected value 108, that is, whether the data 201 is normal or failed.

Figure 2:
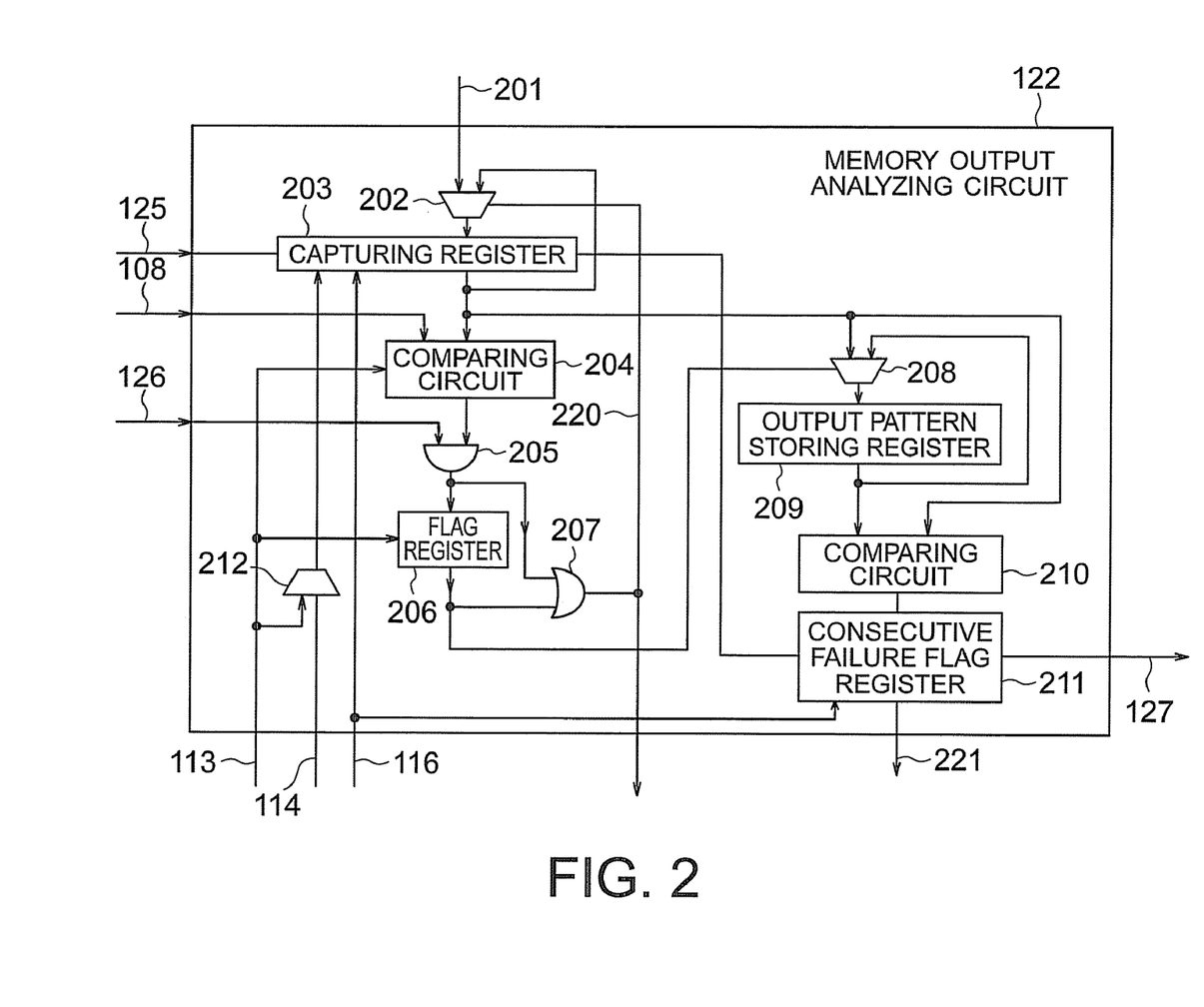
FIG. 2 schematically shows the configuration of a memory output analyzing circuit included in the semiconductor integrated circuit.

The following will discuss the configuration and operations of the memory output analyzing circuit 122. FIG. 2 schematically shows the configuration of the memory output analyzing circuit 122. The memory output analyzing circuit 122 includes multiplexers 202, 208 and 212, a capturing register 203, comparing circuits 204 and 210, an AND circuit 205, a flag register 206, an OR circuit 207, an output pattern storing register 209, and a consecutive failure flag register 211.

The data 201 read from the memory cell 121 is temporarily inputted to the capturing register 203 through the multiplexer 202.

At this point, the multiplexer 202 is fed with an output from the capturing register 203 as well as the data 201 read from the memory cell 121. The outputs of the multiplexer 202 are switched in response to a flag signal 220 which is outputted from the OR circuit 207 and indicates the detection of a failure.

Until a failure is detected, the flag signal 220 is in a logic "0" state and an output from the memory cell 121 is outputted as it is from the multiplexer 202.

Once a failure is detected and the multiplexer 202 is fed with the flag signal 220 which is in a logic "1" state, the output from the capturing register 203 is selected and outputted. Thus the capturing register 203 keeps the same output.

Data outputted from the capturing register 203 is compared, in the comparing circuit 204, with the data expected value 108 generated in and outputted from the data generator 102. While the data matches with the data expected value, a comparison result signal outputted from the comparing circuit 204 is in the logic "0" state. When the data does not match the data expected value, that is, when a failure is detected, the signal is in the logic "1" state.

The comparison result signal and a flag suppressing signal 126 outputted from the diagnosis data storing circuit 106 are supplied to the AND circuit 205. As will be described later, since a failure is not detected at the start of BIST, the flag suppressing signal 126 is in the logic "1" state, so that the comparison result signal is outputted as it is from the AND circuit 205.

However, once a failure is detected, the flag suppressing signal 126 is in the logic "0" state from the time the BIST is restarted at an earlier point to the time the BIST reaches the point of failure. Thus the comparison result signal is not outputted from the AND circuit 205 and the AND circuit 205 keeps outputting the signal in the logic "0" state.

An input signal to the flag register 206 (the output signal of the AND circuit 205) and the output signal of the flag register are inputted to the OR circuit 207. As described above, the flag signal 220 outputted from the OR circuit 207 is supplied to the multiplexer 202. Further, the flag signal 220 is also supplied to the result analyzer 105 and the diagnosis data storing circuit 106 in the BIST circuit 100.

The data outputted from the capturing register 203 is inputted to the output pattern storing register 209 through the multiplexer 208.

At this point, the multiplexer 208 is fed with an output from the output pattern storing register 209 as well as the data outputted from the capturing register 203. The outputs of the multiplexer 208 are switched in response to the output signal of the flag register 206.

While the output logic of the flag register 206 is "0", the output of the capturing register 203 is outputted as it is from the multiplexer 208. When the output logic of the flag register 206 is "1", the output from the output pattern storing register 209 is selected and outputted. Thus the output pattern storing register 209 keeps the same output.

Data outputted from the output pattern storing register 209 is compared, in the comparing circuit 210, with the data outputted from the capturing register 203. When there is a match between the data (patterns), the comparing circuit 210 outputs a logic "1" to the consecutive failure flag register 211. When there is a mismatch, the comparing circuit 210 outputs a logic "0" to the consecutive failure flag register 211.

The consecutive failure flag register 211 outputs a consecutive failure flag signal 221 to the BIST control circuit 101. The BIST control circuit 101 does not stop the BIST operation while the consecutive failure flag signal 221 is in the logic "1" state.

The capturing register 203 and the consecutive failure flag register 211 are shifted to a shift mode by setting the logic of the shift enable signal 116 at "1", and the capturing register 203 and the consecutive failure flag register 211 compose a shift register from a shift input 125 to a shift output 127.

Figure 3:
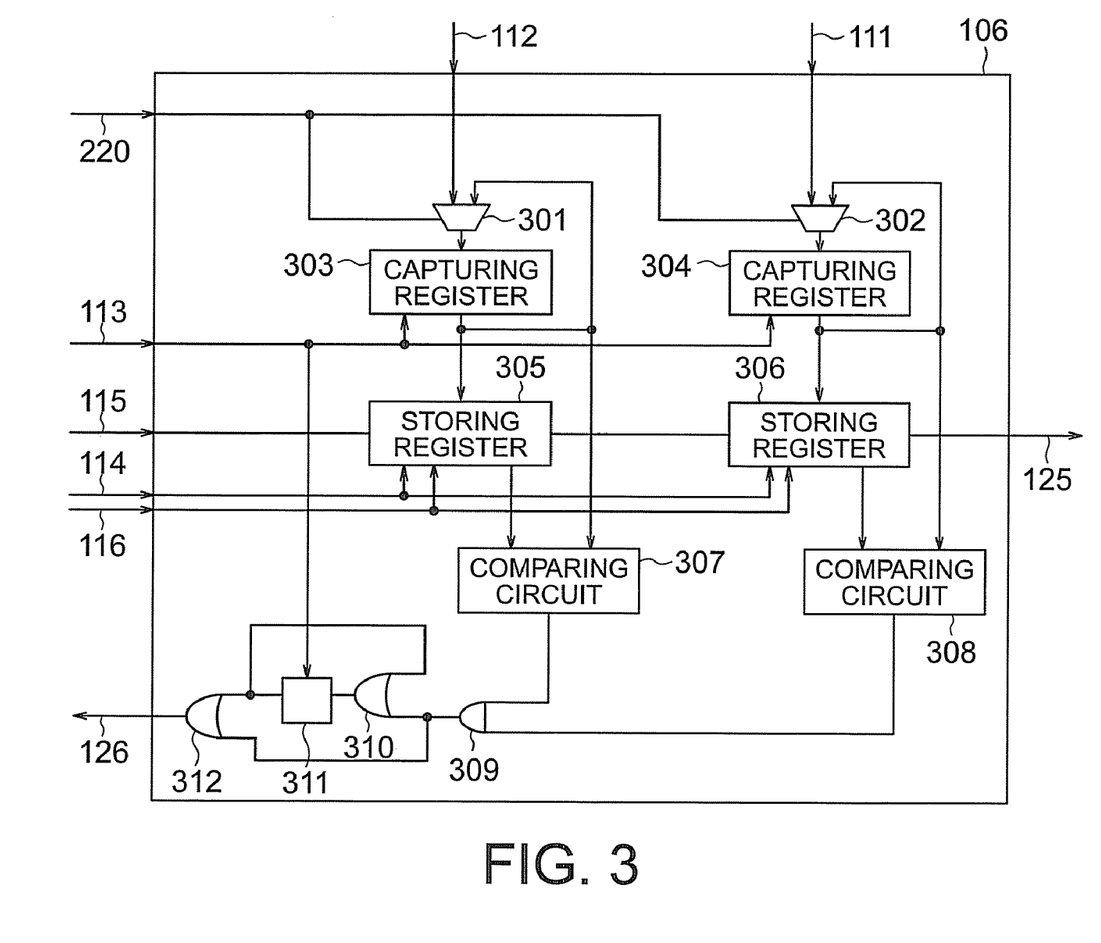
FIG. 3 schematically shows the configuration of a diagnosis data storing circuit included in the semiconductor integrated circuit.

The following will discuss the configuration and operations of the diagnosis data storing circuit 106 included in the BIST circuit 100 for conducting failure diagnosis. FIG. 3 schematically shows the configuration of the diagnosis data storing circuit 106.

For an address signal 112 outputted from the address generator 103 and a BIST state signal 111 outputted from the BIST control circuit 101, the diagnosis data storing circuit 106 includes multiplexers 301 and 302, capturing registers 303 and 304, storing registers 305 and 306, and comparing circuits 307 and 308. The diagnosis data storing circuit 106 further includes an AND circuit 309, OR circuits 310 and 312, and a comparison state register 311.

The address signal 112 and the BIST state signal 111 are respectively captured to the capturing registers 303 and 304 through the multiplexers 301 and 302 in synchronization with the high speed clock 113.

At this point, the multiplexers 301 and 302 are also fed with outputs from the capturing registers 303 and 304. After that, any of the signals is selected in response to the flag signal 220 and is outputted from the multiplexers 301 and 302.

In the case where no failure is detected in the memory output analyzing circuit 122 and the flag signal 220 is in the logic "0" state, the address signal 112 and the BIST state signal 111 are outputted from the multiplexers 301 and 302 and are held in the capturing registers 303 and 304.

Once a failure is detected and the flag signal 220 is in the logic "1" state, the multiplexers 301 and 302 select and output the outputs from the capturing registers 303 and 304, so that the capturing registers 303 and 304 keep the current holding states. Thus even when another address signal 112 and another BIST state signal 111 are inputted to the multiplexers 301 and 302, the contents of the capturing registers 303 and 304 are not updated.

In other words, once a failure is detected, the BIST is restarted from the beginning and the capturing registers 303 and 304 keep the held contents while the flag is suppressed until the BIST reaches the point of failure.

The outputs from the capturing registers 303 and 304 are captured by the storing registers 305 and 306 having the same bit width, in synchronization with the low speed clock 114.

In this configuration, the output terminal of the storing register 305 is serially connected to the input terminal of the storing register 306. The shift input 125 from the storing register 306 is observed by the external tester 130 and possible locations of failures are extracted by failure diagnosis.

The capturing registers 303 and 304 capture, hold, and output data in synchronization with the high speed clock 113 so as to operate at the same speed as the memory cell 121. On the other hand, the storing registers 305 and 306 capture, hold, and output data in synchronization with the low speed clock 114. This is because when the outputs of the storing registers 305 and 306 are shifted and are observed by the external tester 130, the operating speeds of the registers have to be matched with the operating speed of the external tester 130 having a lower speed than the memory cell 121, in order to avoid a high operating speed disabling observations.

When the shift enable signal 116 is in the logic "0" state, the storing registers 305 and 306 capture and hold the outputs from the capturing registers 303 and 304, and outputs the outputs to the comparing circuits 307 and 308 in synchronization with the low speed clock 114.

The storing registers 305 and 306 are shifted to the shift mode by setting the logic of the shift enable signal 116 at "1", and the storing registers 305 and 306 compose a shift register from a shift input 115 to a shift output (the shift input 125 to the capturing register 203 in the memory output analyzing circuit 122). Thus data from a memory cell in which a failure has been detected can be outputted to the external tester 130 after the BIST is suspended.

After a failure is detected in the BIST and the BIST operation is suspended, the shift enable signal 116 is in the logic "0" state at the restart of the BIST operation. Thus data outputted from the capturing registers 303 and 304 is transferred to and held in the storing registers 305 and 306, and then is outputted to the comparing circuits 307 and 308.

At the detection of a failure, the flag signal 220 is in the logic "1" state. After the BIST is restarted, the signal changes to the logic "0". Thus the address signal 112 and the BIST state signal 111 are captured and held again in the capturing registers 303 and 304 through the multiplexers 301 and 302.

The held contents of the capturing registers 303 and 304 are supplied to the comparing circuits 307 and 308 together with the held contents of the storing registers 305 and 306, and the contents are compared in the comparing circuits 307 and 308.

When the contents match with each other and the outputs of the comparing circuits 307 and 308 are both in the logic "1" state, that is, after a failure is detected, the BIST is restarted from the beginning. At the point of failure, the output of the AND circuit 309 is in the logic "1" state.

The logic "1" is outputted from the OR circuit 310 and an output value from the comparison state register 311 is set to the logic "1" for the first time.

Thereafter, the outputs from the capturing registers 303 and 304 are supplied to and held once in the storing registers 305 and 306. After that, the contents are kept and outputs from the capturing registers 303 and 304 are not captured. In other words, the address signal 112 and the BIST state signal 111 at the detection of a failure are held.

The logic "1" outputted from the comparison state register 311 is outputted as the flag suppressing signal 126 through the OR circuit 312, and is supplied to the AND circuit 205 in the memory output analyzing circuit 122. In this case, at the restart of the BIST, the comparison state register 311 is reset to hold the logic "0" and enters a suppressed state.

With the OR circuit 310, the comparison state register 311, and the OR circuit 312, once the logic "1" is outputted from the AND circuit 309, the output state of the logic "1" from the OR circuit 312 is kept thereafter.

After that, the flag signal 220 from the OR circuit 207 keeps the logic "1" and this value is inputted to a control terminal for switching the outputs of the multiplexer 202 in the memory output analyzing circuit 122. Thus an output from the memory cell 121 is not supplied to the input of the capturing register 203 through the multiplexer 202 but the output of the capturing register 203 is fed back to the input, so that the capturing register 203 keeps the current value.

However, while the flag suppressing signal 126 from the diagnosis data storing circuit 106 in the BIST circuit 100 is in the logic "0" state, the output of the AND circuit 205 is in the logic "0" state and the input to the flag register 206 is kept in the logic "0" state. Thus even when the output of the memory cell 121 has a failure, the input to the flag register 206 is not in the logic "1" state, so that the capturing operation is not suppressed and the BIST is continued.

Thus until the final detection of a failure in the previous BIST, the BIST can be continued without observing a detected failure, that is, without setting the flag signal 220 in the logic "1" state for the detected failure.

The capturing register 203 is operated by the same high speed clock 113 as a high-speed BIST clock during the BIST. Thus the BIST can be performed by a high speed clock generated by an on-chip clock generating circuit and the like.

When the BIST operation is suspended, the low speed clock 114 which can be directly controlled in the BIST circuit 100 is selected and outputted by the multiplexer 212, and is supplied to the capturing register 203 and operated therein.

The low speed clock 114 is similar to a clock supplied to the storing registers 305 and 306 in the diagnosis data storing circuit 106 and is supplied from the same clock source.

As described above, the storing registers 305 and 306 compose a shift register in the shift mode. To the shift register, the capturing register 203 and the consecutive failure flag register 211 are serially connected to compose another shift register. With this configuration, the address signal 112, the BIST state signal 111, the output and consecutive failure information from the memory cell 121 can be extracted to the outside at the detection of a failure, inputted to the external tester 130, and observed therein.

When conducting BISTs on the plurality of memory cells 121 in the single BIST circuit 100, the capturing register 203 and the consecutive failure flag register 211 in the memory output analyzing circuit 122 provided for each of the memory cells 121 are serially connected to compose another shift register.

Figure 4:
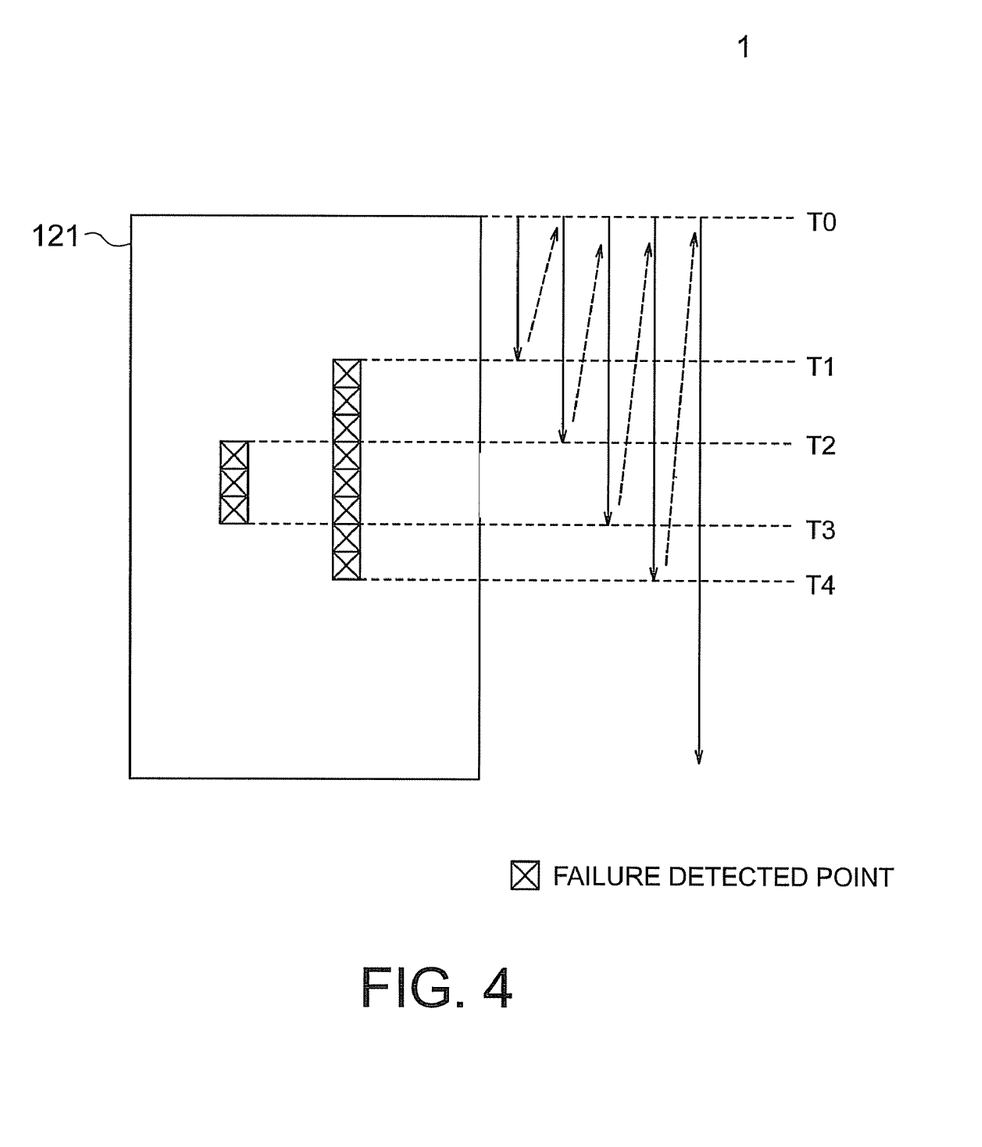
FIG. 4 is an explanatory drawing showing the steps of failure diagnosis on a memory in the semiconductor integrated circuit.

FIG. 4 shows an example of the steps of conducting the BIST according to the present embodiment.

At time T0, the BIST operation is started.

When a failure is detected at time T1, a data pattern (failed data pattern) is stored in the pattern storing register 209 and the BIST operation is suspended. The BIST state signal 111, the address signal 112, the output (stored in the capturing register 203) and consecutive failure information (stored in the consecutive failure flag register 211) from the memory cell 121 are outputted to the external tester. Further, address data on the detection of the failure and the BIST state signal are stored in the storing registers 305 and 306. Thereafter, the BIST is restarted from time T0. This is because restart from time T1 at which the BIST is suspended interposes a shifting operation between consecutive operations and disables the BIST at an actual speed.

After the BIST is restarted, the flag is suppressed until time T1. Thus even at time T1, a failure is not regarded as detectable.

A similar failed pattern continues from time T1 to time T2. In this case, a data pattern captured into the capturing register 203 and the data pattern stored in the output pattern storing register 209 match with each other. Thus a consecutive failure flag is raised and the BIST is continued.

At time T2, an output different from an output stored in the output pattern storing register 209 is obtained and the output is also a failed pattern. Thus the BIST is suspended, and information on the end of consecutive failures and failure information on the current address are outputted. Further, the failed pattern is stored and the BIST is restarted from time T0.

After the BIST is restarted, the BIST returns to the original failed pattern (at time T1 to T2) at time T3. Since the original pattern is different from the currently stored pattern, the BIST is suspended and information on the end of consecutive failures and failure information on the current address are outputted. Further, the failed pattern is stored and the BIST is restarted from time T0.

After the BIST is restarted, normal data is outputted at time T4. Since the data pattern is different from the stored data pattern, the BIST is suspended, information on the end of consecutive failures is outputted, and the BIST is restarted from time T0.

In this way, complete failure information on the consecutively similar failed data patterns is obtained for each address without suspending the BIST and a fail bit map can be produced.

Figure 5:
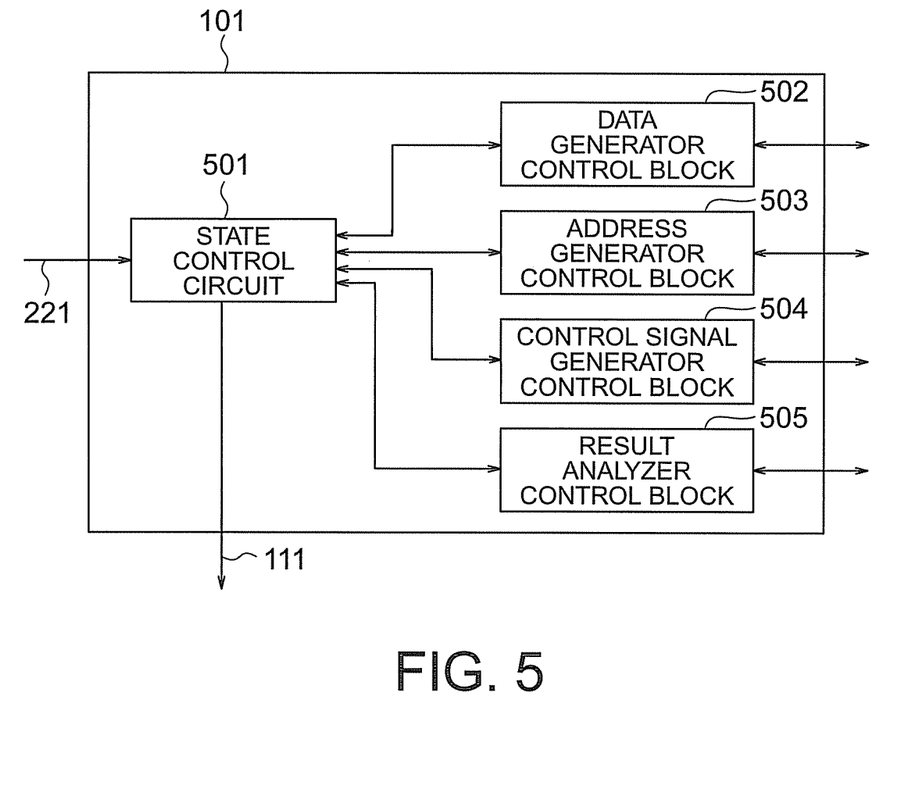
FIG. 5 schematically shows the configuration of a BIST control circuit included in a BIST circuit provided in the semiconductor integrated circuit.

FIG. 5 schematically shows the configuration of the BIST control circuit 101. The BIST control circuit 101 includes a state control circuit 501, a data generator control block 502, an address generator control block 503, a control signal generator control block 504, and a result analyzer control block 505.

The state control circuit 501 controls a change of a BIST state, that is, a BIST sequence. The BIST state signal 111 indicating the current state of the state control circuit 501 is outputted from the state control circuit 501. Further, the state control circuit 501 is fed with the consecutive failure flag 221 to decide whether the BIST should be suspended or not.

The data generator control block 502 controls the subsequent operation while monitoring the state of the data generator 102.

The address generator control block 503 controls the subsequent operation while monitoring the state of the address generator 103.

The control signal generator control block 504 controls the subsequent operation while monitoring the state of the control signal generator 104.

The result analyzer control block 505 controls the subsequent operation while monitoring the state of the result analyzer 105.

Figure 6:
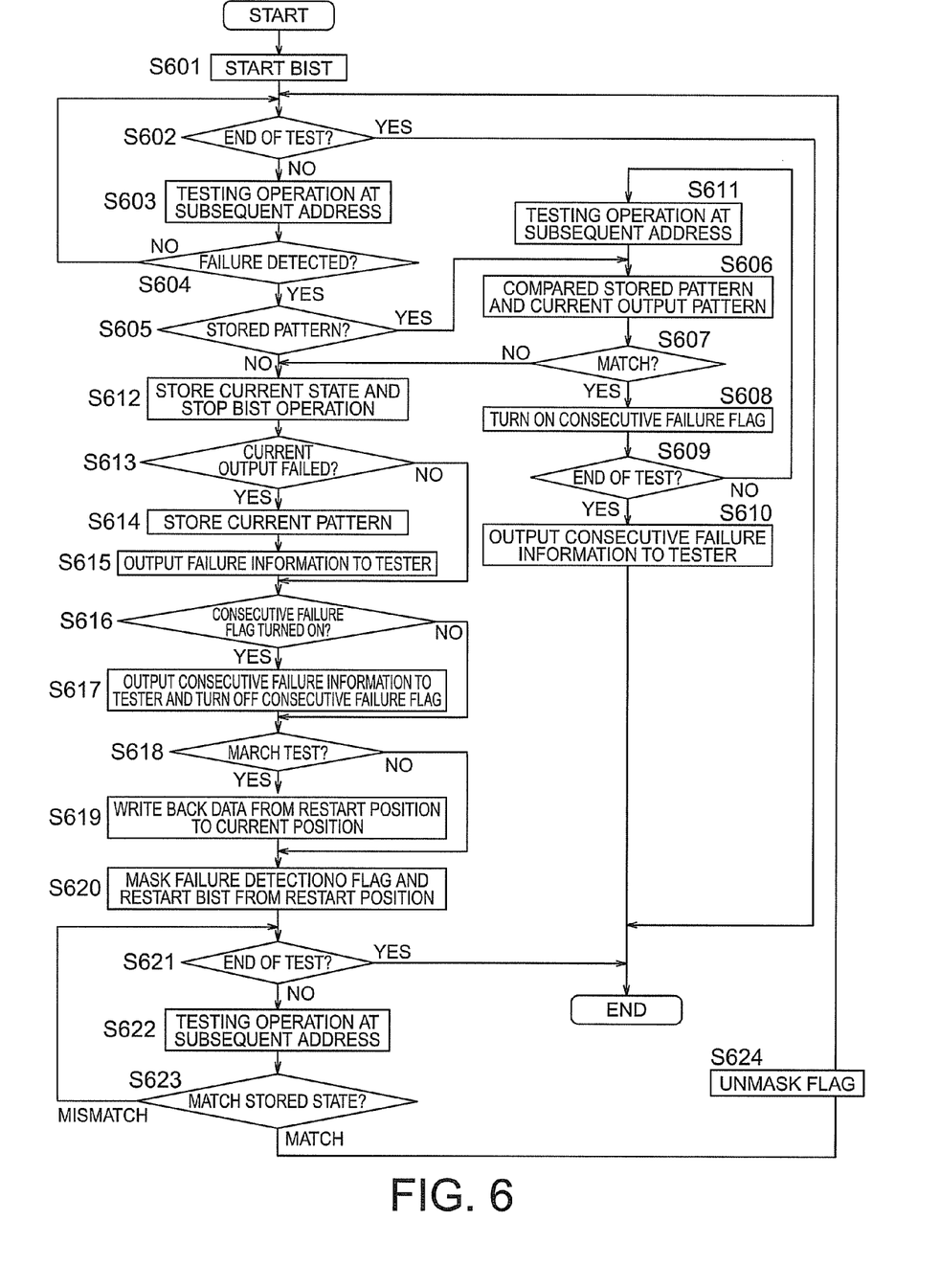
FIG. 6 is a flowchart showing the operational steps of failure diagnosis on the memory in the semiconductor integrated circuit.

FIG. 6 shows a flow of failure diagnosis conducted on the memory with the BIST control circuit 101.

(Step S601) The state control circuit 501 starts conducting the BIST.

(Step S602) It is decided whether to complete the BIST. In the case of completion, the BIST is completed, otherwise the process advances to step S603.

(Step S603) The BIST operation is conducted at the subsequent address.

(Step S604) The presence or absence of a detected failure is decided. When a failure is detected, the process advances to step S605, otherwise the process returns to step S602.

(Step S605) It is decided whether a pattern is stored in the pattern storing register 209. When a pattern is stored, the process advances to step S606, otherwise the process advances to step S612.

(Step S606) The stored data pattern and a currently outputted pattern (a pattern stored in the capturing register 203) are compared with each other, and the process advances to step S607.

(Step S607) It is decided whether the patterns match with each other as a result of the comparison. When the patterns match with each other, the process advances to step S608, otherwise the process advances to step S612.

(Step S608) Since similar failed patterns consecutively appear, the consecutive failure flag is raised, that is, the output from the comparing circuit 210 to the consecutive failure flag register 211 is set to logic "1", and then the process advances to step S609.

(Step S609) It is decided whether to complete the BIST. For completion, the process advances to step S610, otherwise the process advances to step S611.

(Step S610) Consecutive failure information is outputted to the external tester, and the BIST is completed.

(Step S611) The BIST operation is performed at the subsequent address, and the process advances to step S606.

(Step S612) The current output pattern is stored in the capturing register 203 and the address signal 112 and the BIST state signal 111 are stored in the capturing registers 303 and 304, respectively. After that, the BIST operation is suspended.

(Step S613) It is decided whether the current output is failed or not. When the current output is failed, the process advances to step S614, otherwise the process advances to step S616.

(Step S614) The current output pattern is stored in the pattern storing register 209.

(Step S615) Information on the end of consecutive failures and failure information at the current address are outputted to the external tester.

(Step S616) It is decided whether the consecutive failure flag is raised or not. When the flag is raised, the process advances to step S617, otherwise the process advances to step S618.

(Step S617) The consecutive failure information is outputted to the external tester and the consecutive failure flag is turned off.

(Step S618) It is decided whether a march test has been conducted in the BIST. When a march test has been conducted, the process advances to step S619, otherwise the process advances to step S620.

(Step S619) The process returns to the restart of the BIST, and data is written back to data at the suspension of the BIST.

(Step S620) The failure detection flag is masked and the BIST is conducted again from the point of the restart of the BIST. Since the flag suppressing signal 126 is set to logic "0" and the flag signal 220 is set to logic "0", the capturing of the data 201 having been read from the memory cell 121 into the capturing register 203 is not suppressed.

(Step S621) It is decided whether to complete the BIST. In the case of completion, the BIST is completed, otherwise the process advances to step S622.

(Step S622) The BIST operation is performed at the subsequent address.

(Step S623) The stored contents of the capturing registers 303 and 304 and the storing registers 305 and 306 are compared with each other. When the contents match with each other, the process advances to step S624, otherwise the process returns to step S621.

(Step S624) The flag is unmasked and the process returns to step S602. The flag suppressing signal 126 is set to the logic "1" and enters a failure detection state.

The external tester 130 produces the fail bit map of a memory to be diagnosed, based on the failure detection information and information on the range of consecutive failures from the point (consecutive failure information).

According to the present embodiment, an outputted failed pattern and a stored failed pattern are compared with each other. When similar failed patterns consecutively appear, only the consecutive failure flag is raised and the BIST is not suspended. Thus it is possible to reduce the number of times of suspension and restart of BIST and shorten the failure diagnosis time.

Further, the BIST is conducted using the high speed clock used in a normal operation of a memory, and a BIST result is shifted out using the low speed clock enabling the operation of the external tester. Consequently, it is possible to obtain information on a failure occurring only in an actual speed test.

Comparative Example

Figure 7:
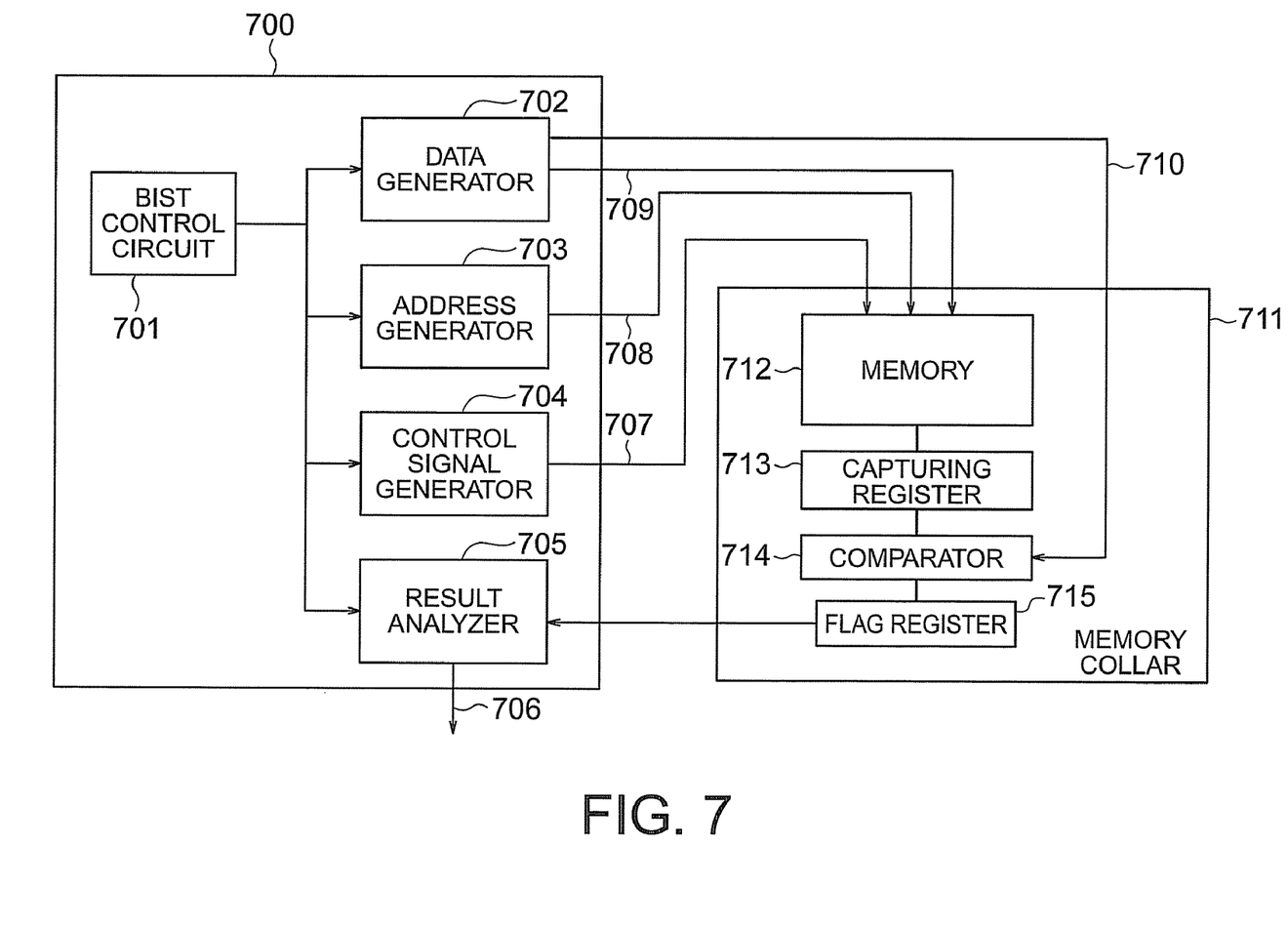
FIG. 7 schematically shows the configuration of a semiconductor integrated circuit for conducting a BIST operation with a BIST circuit of a comparative example.

FIG. 7 schematically shows the configuration of a semiconductor integrated circuit for conducting a BIST operation with a BIST circuit of a comparative example.

A BIST control circuit 701 in a comparator BIST circuit 700 controls a data generator 702, an address generator 703, and a control signal generator 704 to sequentially generate and output necessary signals.

A memory 712 is included in a block called a memory collar 711, together with a capturing register 713, a comparator 714, and a flag register 715 which are logical elements required for a testing operation.

The memory 712 is fed with written data 709 generated from the data generator 702, address data 708 generated from the address generator 703, and a control signal 707 generated from the control signal generator 704.

An output from the memory is inputted once to the capturing register 713, and the output is compared by the comparator 714 with a data expected value 710 generated from the data generator 702, and the result is held in the flag register 715.

A flag output is inputted to a result analyzer 705 of the BIST circuit 700, and a final BIST result is outputted as a BIST result output 706.

When conducting tests on a plurality of memories in a single BIST circuit, flag data from the memories is inputted to the result analyzer 705 and the presence or absence of a failure is determined based on the overall tests, and then the BIST result output 706 is outputted.

Figure 8:
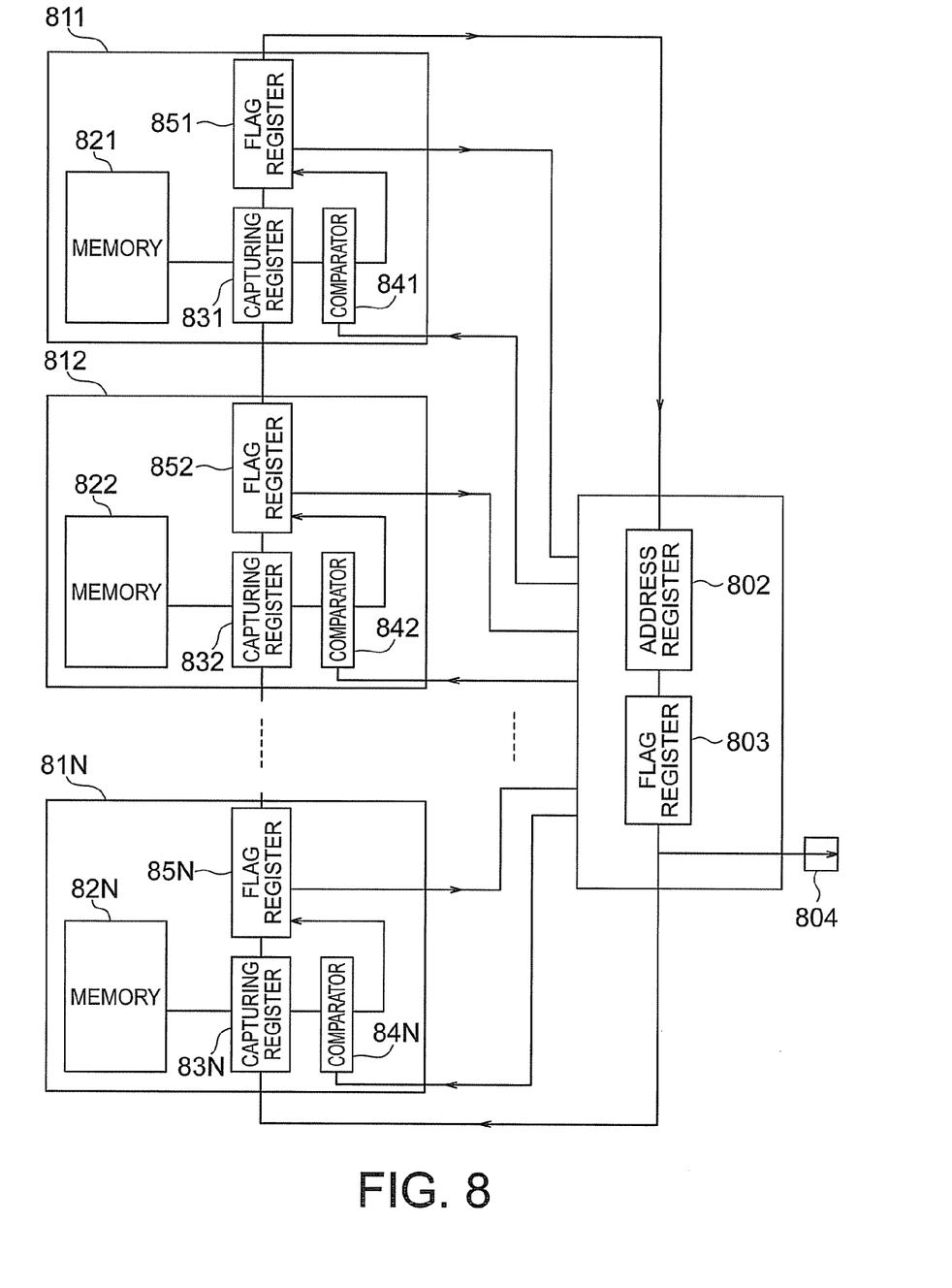
FIG. 8 schematically shows a configuration for conducting failure diagnosis with the semiconductor integrated circuit of the comparative example.

The following will describe a method of identifying the bit position of a failed point of a memory by serially observing the outputs of the memory with the BIST circuit according to the timing of reading of a BIST.

For example, as shown in FIG. 8, capturing registers 831, 832, . . . and 83N for capturing the outputs of memories 821, 822, . . . 82N in memory collars 811, 812, . . . 81N and flag registers 851, 852, . . . 85N for receiving outputs from comparators 841, 842, . . . 84N are serially connected, and the registers compose a single circular shift path together with a register 802 provided in an address generating circuit in the BIST circuit and a flag register 803 for an overall BIST.

The shift path is used during failure diagnosis and the values of the registers are shifted out through an external output terminal 804 at the time of reading. Since the shift path is circular, the BIST circuit can recover to the suspended state of the BIST operation after the values of the registers are shifted out.

Thereafter, the BIST is restarted and the values of the registers are shifted out again in the subsequent reading. By repeatedly suspending the BIST operation, shifting out the values of the registers, and restarting the BIST operation, states in the memories can be read out.

Based on the result, it is possible to produce a fail bit map indicating the bit position of a failure in the cell array of the memory, so that the failure can be analyzed.

In this method, however, the value of a register has to be shifted out also in a memory not to be diagnosed, resulting in an extremely long test time depending upon the configuration of the memory tested in a single BIST circuit.

Further, a test pattern for failure diagnosis in the BIST may be too large to be stored in the memory of the tester. Moreover, in a shifting operation, a shift output has to be observed and compared with an expected value by means of an external tester, so that the observation and comparison are restricted by the operating speed of the tester.

Therefore, it is difficult to obtain failure diagnosis information similar to the result of an actual speed test by means of a clock generating circuit and the like in a semiconductor integrated circuit.

Figure 9:
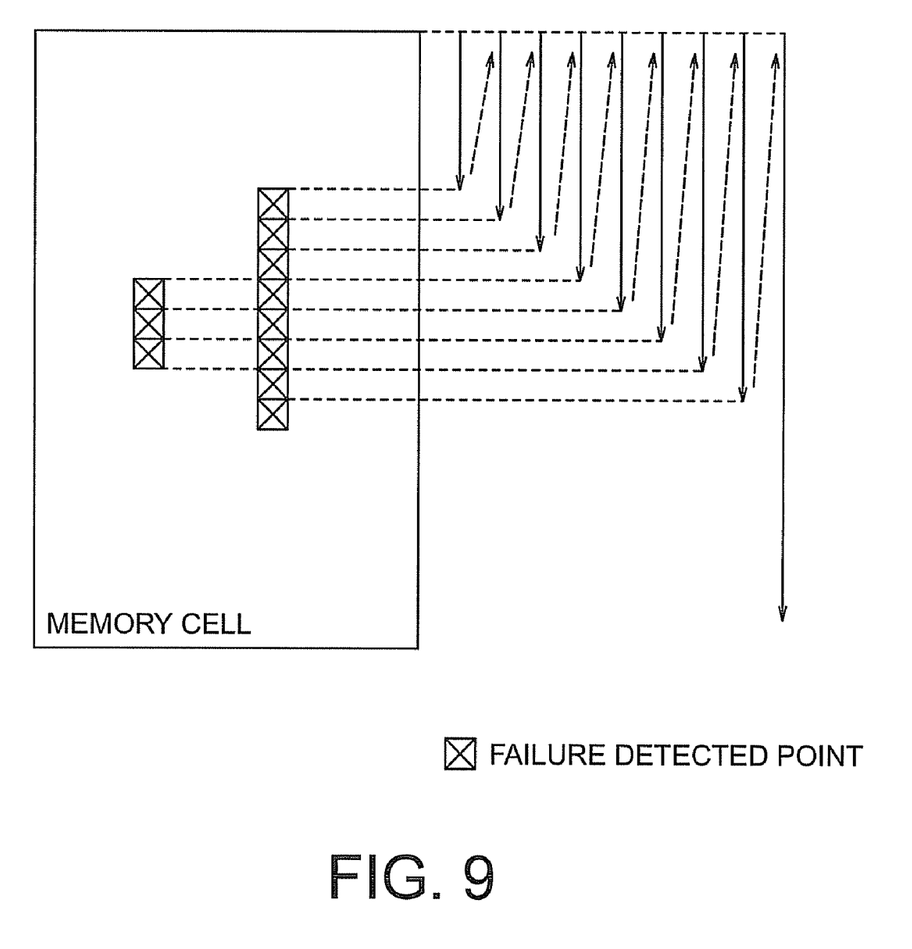
FIG. 9 is an explanatory drawing showing the steps of failure diagnosis on a memory in the semiconductor integrated circuit of the comparative example.

Further, as shown in FIG. 9, in the failure diagnosis of a memory in which similar failed patterns consecutively appear, the BIST is suspended and restarted every time a failure is detected, resulting in an extremely large number of restarts.

Contrary to this method, as described above, when similar failed patterns consecutively appear, the present embodiment can reduce the number of restarts of BIST by outputting consecutive failure information without suspending the BIST. Thus the failure diagnosis time can be shortened. Moreover, failure diagnosis can be conducted at an actual operating speed.

Figure 10:
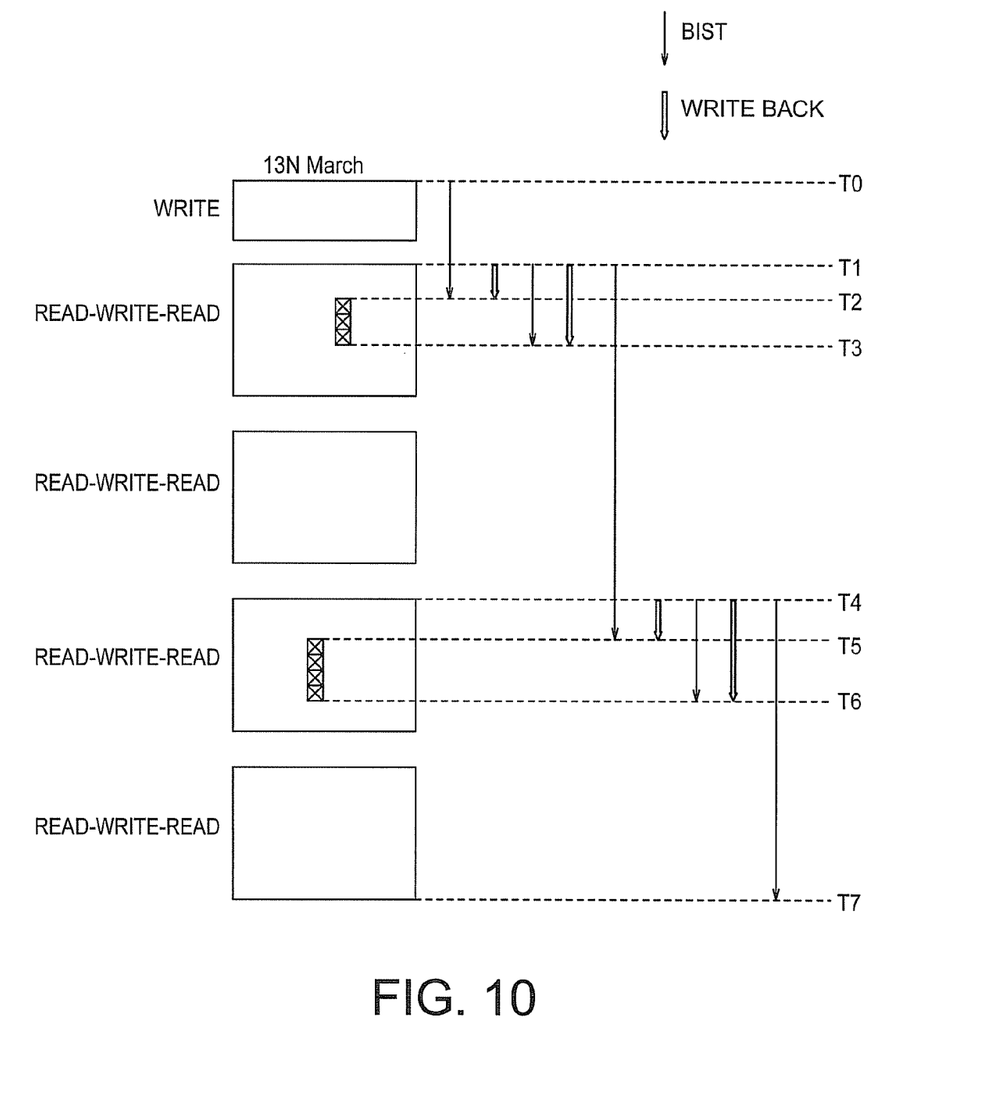
FIG. 10 is an explanatory drawing showing the steps of failure diagnosis on a memory in a semiconductor integrated circuit of a modification.

The aforementioned embodiment is an example and it should be considered that the present invention is not limited by the embodiment. For example, although the BIST to be restarted is conducted from the beginning in the embodiment, the BIST may not be conducted from the beginning. Referring to FIG. 10, the following will describe an example of a BIST (march test) called a 13N marching pattern.

In this example, the marching pattern is a pattern for sequentially performing, at each address, a series of operations (march element r0w1r1) of reading, e.g., a logic "0" from a memory which is in a logic "0" state, writing a logic "1", and reading the logic "1". The state of the memory is changed from the logic "0" to the logic "1".

First, at time T0, a BIST operation is started as WRITE operation to write a predetermined data pattern at all the addresses of the memory cell 121.

Next, as READ-WRITE-READ operation, forward data patterns (e.g., 1010) are read and reverse data patterns (e.g., 0101) are written at the respective addresses in ascending order of the addresses. And then, the reverse data patterns are read and the forward data patterns are written at the respective addresses in ascending order of the addresses.

Further, the forward data patterns are read and the reverse data patterns are written at the respective addresses in descending order of the addresses. And then, the reverse data patterns are read and the forward data patterns are written at the respective address in descending order of address.

At time T2, a first failed pattern is detected. Since no pattern is stored, the BIST operation is suspended to output failure information, and the current pattern, address data, and a BIST state signal are stored. After that, the BIST operation is restarted. In this case, the BIST operation is restarted at time T1 which is a break of a marching operation.

It should be noted that when a conducted BIST is a marching operation, data at an address where the BIST is restarted (time T1) has been rewritten to different data by replacing the forward pattern and the reverse pattern, and thus a correct operation cannot be obtained in a marching test in which a reading operation is premised on a state before rewriting.

Thus data from the time the BIST is restarted (time T1) to the time the BIST is suspended (time T2) is written back. The data is written back between time T1 and time T2, and the BIST operation is restarted after returning to time T1 again.

After the BIST is restarted, a failure is not regarded as detectable until time T2. Further, from time T2 to time T3, a similar failed pattern continues (matches with a stored pattern) and thus the consecutive failure flag is raised without suspending the BIST operation.

At time T3, the failed pattern recovers to a normal pattern and the stored pattern and the output pattern are different from each other. Thus the BIST operation is suspended and information on the end of consecutive failures is outputted. After that, the BIST returns to time T1, the data is written back between time T1 and time T3, and then the BIST operation is restarted after returning to time T1 again.

Thereafter, a failed pattern is detected at time T5. Since the pattern is different from the stored pattern, the BIST operation is suspended to output failure information, and the current pattern, address data, and the BIST state signal are stored. After that, the BIST operation is restarted. The BIST operation is restarted at time T4 which is a break of the marching operation. Data is written back between time T4 and T5 and the BIST operation is restarted after returning to time T4 again.

After the BIST is restarted, a failure is not regarded as detectable until time T5. Further, from time T5 to time T6, a similar failed pattern continues (matches with the stored pattern) and thus the consecutive failure flag is raised without suspending the BIST operation.

At time T6, the failed pattern recovers to a normal pattern and the stored pattern and the output pattern are different from each other. Thus the BIST operation is suspended and information on the end of consecutive failures is outputted. After that, the BIST returns to the address at time T4, the data is written back between time T4 and time T6, and then the BIST operation is restarted after returning to time T4 again.

Thereafter, when another failure is not detected, the BIST operation is completed at time T7.

In this way, the BIST operation does not returns to the starting point when restarted, shortening the failure diagnosis time.

Figure 11:
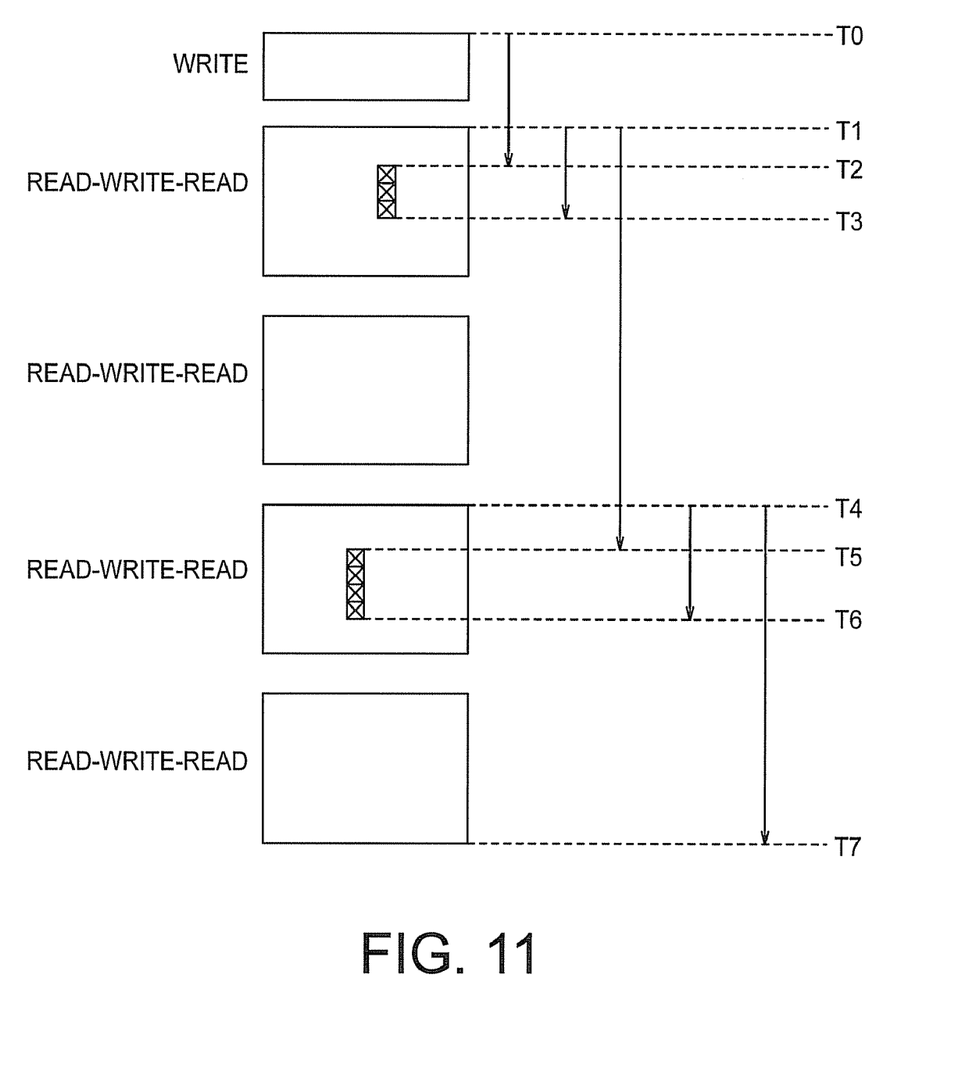
FIG. 11 is an explanatory drawing showing the steps of failure diagnosis on the memory in the semiconductor integrated circuit of the modification.

Moreover, in a walking test in which a BIST operation is performed without rewriting data and the data remains the same unlike a marching pattern, it is not necessary to write back the data. Thus as shown in FIG. 11, the BIST operation can be quickly restarted from the return point.

The BIST operation may be restarted from a point which is returned from a suspension point by a certain address, instead of the break of the marching operation.

When the plurality of memory cells 121 are tested in the single BIST circuit 100, the capturing registers 203 and the consecutive failure flag registers 211 in the memory output analyzing circuits 122 provided in the memory cells 121 are serially connected to configure a shift register.

What is claimed is:

1. A semiconductor integrated circuit, comprising:
   a memory collar including a memory device to which an input data pattern is stored and from which a stored pattern is read at an address indicated by an address input of the memory device, and a register configured to store a failed data pattern; and
   a built-in self test circuit configured to write the data pattern in the memory device, output expected value data, and decide whether to continue a test or suspend the test to unload an acquired failure information to outside the integrated circuit, based on a comparison result between the data pattern read from the memory device and the expected value data, and a comparison result between the read data pattern and the failed data pattern previously stored.

2. The semiconductor integrated circuit according to claim 1, wherein when the data pattern read from the memory device and the expected value data do not coincide with each other, the read data pattern from the memory device and the failed data pattern previously stored coincide with each other, the built-in self test circuit decides to continue the test.

3. The semiconductor integrated circuit according to claim 2, wherein the memory collar generates a consecutive failure flag indicating consecutive failures and outputs the flag to the built-in self test circuit.

4. The semiconductor integrated circuit according to claim 1, wherein when the data pattern read from the memory device and the expected value data do not coincide with each other, and the read data pattern from the memory device and the failed data pattern previously stored do not coincide with each other, the built-in self test circuit decides to suspend the test and output the failure information to the outside.

5. The semiconductor integrated circuit according to claim 4, wherein the register stores the read data pattern from the memory device as a new failed pattern.

6. The semiconductor integrated circuit according to claim 4, wherein the built-in self test circuit restarts the test from a restart point preceding a suspension point, after the failure information is outputted.

7. The semiconductor integrated circuit according to claim 6, wherein each test step of built-in self test circuit has the corresponding restart point and before the restart the built-in self test circuit writes data between the restart point and the suspension point with values same with those before test step is reached to the suspension point.

8. The semiconductor integrated circuit according to claim 7, wherein the test is a marching test and the restart point is a break of execution of march elements in the marching test.

9. The semiconductor integrated circuit according to claim 1, wherein when a comparison result between the data pattern read from the memory device and the stored failed data pattern changes from a mismatch to a match during the built-in self test operation, the built-in self test circuit decides to suspend the test and output the failure information.

10. The semiconductor integrated circuit according to claim 9, wherein the built-in self test circuit restarts the test from a restart point preceding a suspension point, after the failure information is outputted.

11. The semiconductor integrated circuit according to claim 10, wherein each test step of the built-in self test circuit has the corresponding restart point and before the restart the built-in self test circuit writes data between the restart point and the suspension point with values same with those before test step is reached to the suspension point.

12. The semiconductor integrated circuit according to claim 11, wherein the test is a marching test and the restart point is a break of execution of march elements in the marching test.

13. A semiconductor integrated circuit, comprising:
   a built-in self test circuit; and
   a memory collar,
   the built-in self test circuit including a data generator configured to generate and output written data and a data expected value;

an address generator configured to generate and output an address signal;

a control signal generator configured to generate and output a control signal;

a result analyzer which is fed with a flag signal to analyze a result of a built-in self test and outputs a built-in self test result signal;

a built-in self test control circuit configured to control operations of the data generator, the address generator, the control signal generator, and the result analyzer, output a built-in self test state signal indicating a state of the built-in self test, and decide whether to suspend the built-in self test based on a consecutive failure flag signal; and a diagnosis data storing circuit including
a first capturing register configured to capture and output, according to a first clock while the flag signal is not supplied, the latest address signal outputted from the address generator and the latest built-in self test state signal outputted from the built-in self test control circuit, and keep an output when the flag signal is supplied;

a storing register configured to store the address signal and the built-in self test state signal at the supply of the flag signal by storing, while a shift enable signal is not supplied, a supplied output from the capturing register according to a second clock having a lower speed than the first clock, and shift out stored contents to outside at the supply of the shift enable signal; and a flag suppressing unit configured to compare an output from the first capturing register and the stored contents of the storing register to output a flag suppressing signal until the latest address signal and the built-in self test state signal which are outputted from the first capturing register match with the address signal and the built-in self test state signal which are stored in the storing register after the flag signal is supplied once, the memory collar including
a memory device fed with the written data, the address signal, and the control signal to perform a writing operation according to the first clock, and reading and outputting the written data; and a memory output analyzing circuit including
a second capturing register which is fed with and captures latest data outputted from the memory device while the shift enable signal is not supplied and the flag signal is not supplied, keeps stored contents when fed with the flag signal, and shifts out the stored contents to the outside when fed with the shift enable signal;

a first comparing circuit configured to compare an output from the second capturing register and the data expected value and output a first comparison result signal indicating detection of a failure in the event of a mismatch;

a flag register configured to output the flag signal based on the first comparison result signal while the register is not fed with the flag suppressing signal, and suppress an output of the flag signal when fed with the flag suppressing signal;

an output pattern storing register which is fed with and captures latest data outputted from the second capturing register and outputs the data while the register is not fed with the flag signal, and keeps an output when fed with the flag signal;

a second comparing circuit configured to compare the output from the second capturing register and the output from the output pattern storing register, and output a second comparison result signal indicating consecutive failures in the event of a match; and a consecutive failure flag register configured to output the consecutive failure flag signal based on the second comparison result signal while the register is not fed with the shift enable signal, and shift out stored contents to the outside when fed with the shift enable signal.

14. The semiconductor integrated circuit according to claim 13, wherein when the multiple memory device are provided, the multiple memory collars are provided accordingly, the second capturing registers and the consecutive failure flag registers in the memory collars are serially connected, and the stored contents are serially shifted out to the outside when the shift enable signal is supplied.

15. The semiconductor integrated circuit according to claim 13, wherein the built-in self test circuit suspends the built-in self test when an output of the consecutive failure flag signal from the consecutive failure flag register is stopped, and restarts the built-in self test from a restart point preceding a suspension point.

16. The semiconductor integrated circuit according to claim 15, wherein each test step of the built-in self test circuit has the corresponding restart point and before the restart the built-in self test circuit writes data between the restart point and to the suspension point with values same with those before test step is reached to the suspension point.

17. A test system of a semiconductor integrated circuit, comprising:
the semiconductor integrated circuit according to claim 13; and
a tester configured to output the shift enable signal according to the second clock, analyze a bit position of a failure in the memory device based on the built-in self test result signal, a shift output from the storing register, a shift output from the second capturing register, and a shift output from the consecutive failure flag register, and produce a fail bit map.

18. The test system of a semiconductor integrated circuit according to claim 17, wherein when the multiple memory devices are provided, the multiple memory collars are provided accordingly,
the second capturing registers and the consecutive failure flag registers in the memory collars are serially connected, and the stored contents are serially shifted out to the outside when the shift enable signal is supplied.

19. The test system of a semiconductor integrated circuit according to claim 17, wherein the built-in self test control circuit suspends the built-in self test when an output of the consecutive failure flag signal from the consecutive failure flag register is stopped, and restarts the built-in self test from a restart point preceding a suspension point.

20. The test system of a semiconductor integrated circuit according to claim 19, wherein each test step of the built-in self test circuit has the corresponding restart point and before the restart the built-in self test circuit writes data between the restart point and the suspension point with values same with those before test step is reached to the suspension point.

* * * * *